United States Patent
Tiengtum

(10) Patent No.: US 7,918,669 B1
(45) Date of Patent: Apr. 5, 2011

(54) INTEGRATED CIRCUIT SOCKET WITH A TWO-PIECE CONNECTOR WITH A ROCKER ARM

(75) Inventor: Pongsak Tiengtum, Ladera Ranch, CA (US)

(73) Assignee: Titan Semiconductor Tool, LLC, Ladera Ranch, CA (US)

( * ) Notice: Subject to any disclaimer, the term of this patent is extended or adjusted under 35 U.S.C. 154(b) by 0 days.

(21) Appl. No.: 12/841,866

(22) Filed: Jul. 22, 2010

(51) Int. Cl.
*H01R 12/00* (2006.01)
*G01R 31/02* (2006.01)

(52) U.S. Cl. .................................. 439/66; 324/754.03
(58) Field of Classification Search .................. 439/66, 439/219, 331; 324/754.03
See application file for complete search history.

(56) References Cited

U.S. PATENT DOCUMENTS

| | | | | |
|---|---|---|---|---|
| 4,295,670 A | * | 10/1981 | Goodall et al. | 285/91 |
| 4,515,425 A | * | 5/1985 | Nakano | 439/73 |
| 4,969,828 A | * | 11/1990 | Bright et al. | 439/68 |
| 5,042,850 A | * | 8/1991 | Culler | 285/320 |
| 5,988,693 A | * | 11/1999 | Street | 285/80 |
| 6,206,431 B1 | * | 3/2001 | Street | 285/80 |
| 6,409,521 B1 | | 6/2002 | Rathburn | |
| 6,889,841 B2 | | 5/2005 | Maccoux et al. | |
| 7,338,293 B2 | * | 3/2008 | Gilk | 439/66 |
| 7,688,094 B2 | * | 3/2010 | Osato | 324/754.03 |
| 7,737,708 B2 | | 6/2010 | Sherry | |

* cited by examiner

*Primary Examiner* — Chandrika Prasad
(74) *Attorney, Agent, or Firm* — Fulwider Patton LLP

(57) ABSTRACT

A socket for testing or connecting an integrated circuit is disclosed having a platform for receiving the integrated circuit and adapted to overlay a piece of test equipment or other board, the platform formed with an array of slots each locating a portion of a two-piece connector assembly. When the integrated circuit is seated on the platform, the two piece connector assemblies pivot so as to make contact between a contact pad on the IC and the board for establishing or evaluating signal transmission by the IC. The platform houses a resilient tubular member that biases the connector assembly in a disengaged position out of contact with the board or test equipment. When the IC is placed on the platform, the bias of the resilient tubular member is overcome and an electrical connection is established across the connector assembly.

6 Claims, 2 Drawing Sheets

INTEGRATED CIRCUIT SOCKET WITH A TWO-PIECE CONNECTOR WITH A ROCKER ARM

BACKGROUND

The present invention relates to a socket that electrically connects an integrated circuit with an IC board. More particularly, the present invention is directed to a socket, such as those used for testing or connecting an integrated circuit, that incorporates an array of two-piece connectors that achieve a positive connection between an IC device under test (DUT) and a board, such as a load board of a piece of test equipment or other fixture.

Integrated circuit tester devices have long been used in the semiconductor industry to test and evaluate the quality of the chips off the manufacturing line. Signal integrity is a critical aspect of chip design and testing. To this end, it is desirable to maintain impedance through a conducting portion of a contact interconnecting the integrated circuit lead to its corresponding load board pad at a particular desired level. The effective impedance of the design is a function of a number of factors. These include width and length of conduction path, material of which the conductive structure is made, material thickness, etc.

When testing the electrical characteristics of a packaged or molded semiconductor device such as an integrated circuit (IC), it is common to utilize a specialized test socket that secures and connects the IC to the equipment that evaluates its performance, i.e. a load board. Many different test sockets have been devised for quickly and temporarily connecting integrated circuit leads of a chip to be tested to a load board of a tester. Automated test apparatus in particular use a number of such sockets. Typical socket arrangements use force brought to bear upon a contact positioned between a lead of the IC and the load board to deform a probe tip of the contact and engage a pad on the load board. Such a configuration provides for positive connection between the pins or contact pads of the DUT and corresponding leads of a test apparatus. Examples of this type of connection can be found, for example, in U.S. Pat. No. 6,409,521 to Rathburn, and U.S. Pat. No. 7,737,708 to Sherry, the teachings and contents of both of which are fully incorporated herein by reference.

Whether it is for testing integrated circuits or for mounting such circuits on a board, appropriate socket-like connectors are needed. Factors such as cost, having a low profile, and shortening the electrical signal path drive the industry to constantly seek to improve on the prior art sockets. The present invention achieves a low cost, low profile solution with a shortened electrical path and is an improvement over the prior art.

SUMMARY OF THE INVENTION

The present invention is a socket for a integrated circuit having a series of contact pads or other electrical connection sites linearly arranged preferably along at least one peripheral edge, the socket including a platform that supports the IC and houses a plurality of connectors that when engaged with the integrated circuit's contact pads, complete an electrical connection between the contact pads and the associated fixture's contacts below the platform. The socket's platform may have a plurality of generally parallel slots for aligning and receiving a corresponding plurality of electrical contacts, one in each slot. Each electrical contact path is formed of a two piece linkage that cooperates to form an electrical connection between the contact pad and the fixture's contact. The two pieces of the contact cooperate together to form a non-deforming, reliable electrical connection between the IC and the board.

The two piece connector assembly is arranged to pivot into an engaged position without deformation of the elements. Deformation is advantageously avoided because components that deform can lose their resiliency and lead to diminished contact or failure of the socket with repeated life cycles. In the present invention, a first piece of the contact is referred to as a "mount" and has generally planar, parallel upper and lower surfaces and a side surface formed with a rounded, bulbous cavity having a slightly upwardly tilted orientation. The rounded cavity is substantially semi-circular with a slightly expanding mouth that accommodates favorable purchase of a rocker arm described below. The rounded cavity transitions along an upper section to the planar upper surface through a curved, finger-like projection, and further transitions at its lower section to define a lip member that slopes upwardly away from the lower surface. The lip member has a curved lower edge that roughly tracks its curved upper edge defining the cavity, and both the upper edge and the lower edge terminate at a forward facing leading edge.

The mount is fixed in the platform so as to remain immobile, and preferably includes a compressive preload from the platform above the upper surface so as to embed the mount slightly into the load board below. The mount functions to receive and act like a fulcrum to a pivot a second member, i.e. the link. The link is formed with an arcuate upper surface that acts as a contact point for connect with the associated contact pad (or pin) of the IC. The arcuate upper surface has a curvature that maintains a smooth, rolling contact with the IC's contact pad as the curved upper surface rotates through its initial stand-by position through its engaged position. Projecting laterally outward and away from the arcuate upper surface of the link is a rocker arm having a neck portion leading to a bulb-like tip. The bulb-like tip of the rocker arm is sized to mate with the cavity of the mount and provide for a pivoting movement of the link. That is, the bulb-like tip of the link when seated in the mount's cavity, can rotate about the end of the bulb-like tip as the neck of the rocker arm swings between the surfaces defining the mouth of the cavity, i.e., between a stand-by or disengaged position where the link is not in contact with both the IC and the test device below, and an engaged position where the link is firmly in contact with mount and the circuit is complete.

A tubular resilient member is positioned behind and beneath the link member to bias the link member into the stand-by or disengaged position when no IC is present. The tubular resilient member is captured in the platform between the link and a shell-shaped supporting surface, and can be made of an elastomer. When an IC is brought to bear against the test socket, the contact pad of the IC pushes the arcuate upper surface of the link downward against the bias of the resilient tubular member. The resilient tubular member, however, still applies a lateral force that maintains the rocker arm of the link in contact with the surface of the mount defining the cavity. As the force of the downward movement of the IC chip overcomes the resilient member's bias, the link will rotate about the mount and the engagement of the rocker arm in the cavity will be forcefully established by the lateral force of the tubular resilient member. The mount has a lower surface that is mated with the electrical contact of the load board or other fixture, and the link is firmly in contact with the IC contact pad. Thus, the interconnection of the rocker arm with the mount's socket completes the circuit between the IC DUT and the associated fixture.

These and many other features of the present invention will best be understood by reference to the following descriptions and figures. However, it is to be understood that while the inventor's best mode has been described and shown, the invention is not to be limited to any particular drawing or description. Rather, it is understood that there may be many variations of the present invention that would be readily appreciated by one of ordinary skill in the art, and the invention encompasses all such variations and modifications.

DETAILED DESCRIPTION OF THE PREFERRED EMBODIMENTS

The description below is presented in the environment of a test board and a test IC. However, it is to be understood that the invention is not so limited in application, and that other uses of the socket are anticipated and contemplated by the inventors. Thus, no limitation should be implied by the use of terms such as "test socket" or "load board." Rather, the invention may be used for any and all applications for which it is appropriate.

Figure 1:
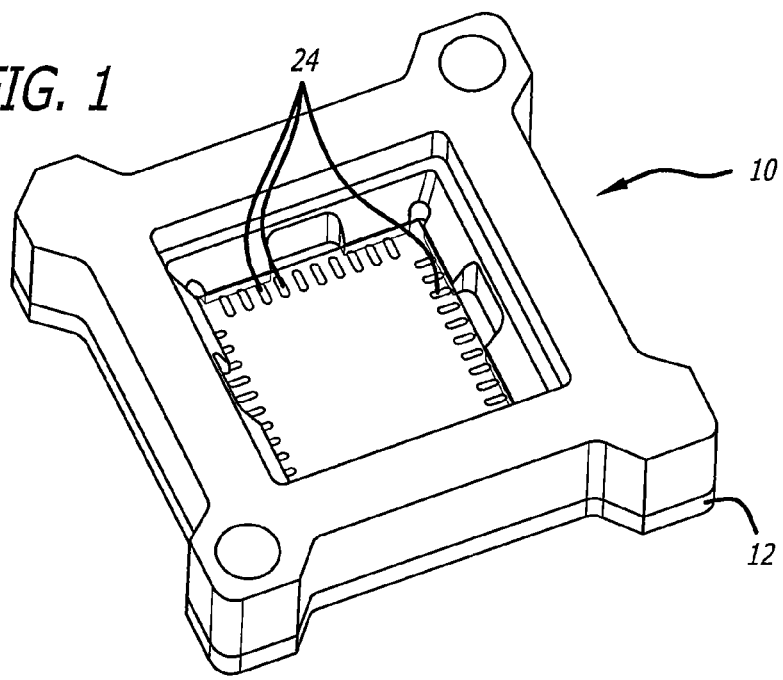
FIG. 1 is an elevated, perspective view of an embodiment of the test socket of the present invention.
Figure 2:
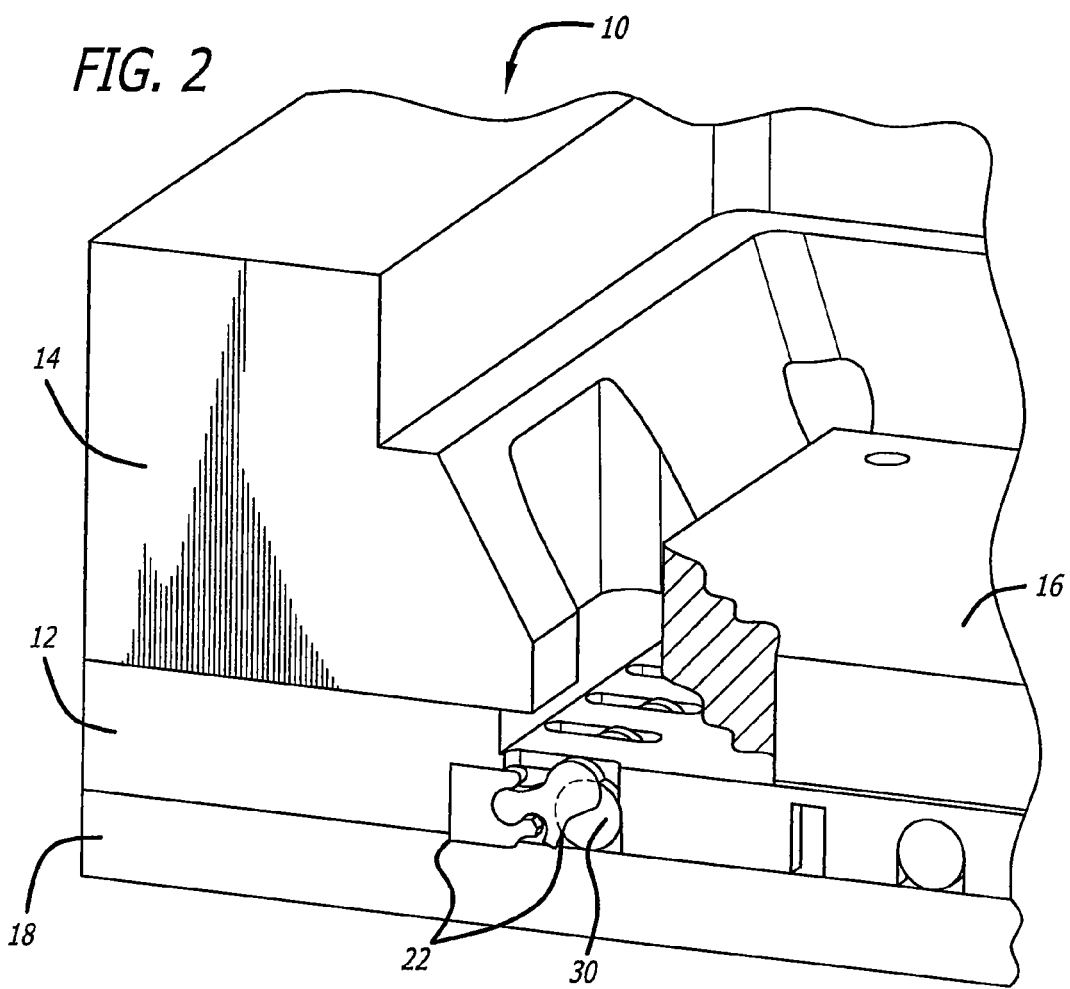
FIG. 2 is an enlarged, elevated cut-away view of a portion of a test socket illustrating the connector structure.

FIG. 1 shows a test socket 10 of the type embodying the present invention having a generally square wall structure defining a well for receiving an integrated circuit component 16. As shown more effectively in FIG. 2, the test socket 10 has a platform 12 that receives the integrated circuit 16 thereon. The socket 10 is shown on a pad 18 that represents a piece of test equipment that can receive electrical signals from the IC 16 and assess the quality, strength, and other characteristics of the signal. The purpose of the test socket 10 is to electrically pass signals from the contact pad 20 of the IC 16 to the test equipment 18 via a connector assembly 22. The connector assembly 22 pivots between a stand-by or disengaged position where no IC is present, and an engaged position (FIG. 3), where the engaged position corresponds to the completed electrical circuit between the IC and the test equipment through the connector 22. The platform 12 has a plurality of slots 24 that allow a portion of the connector 22 to emerge from an upper surface. As explained below, when the IC 16 is placed on the platform 12, the pads 20 of the IC 16 each contact a portion of connectors 22 protruding through the slots 24, and cause the connectors 22 to pivot into the engaged position. In this way, the electrical contact is established reliably and automatically when the IC is placed on the test socket platform 12.

Figure 3:
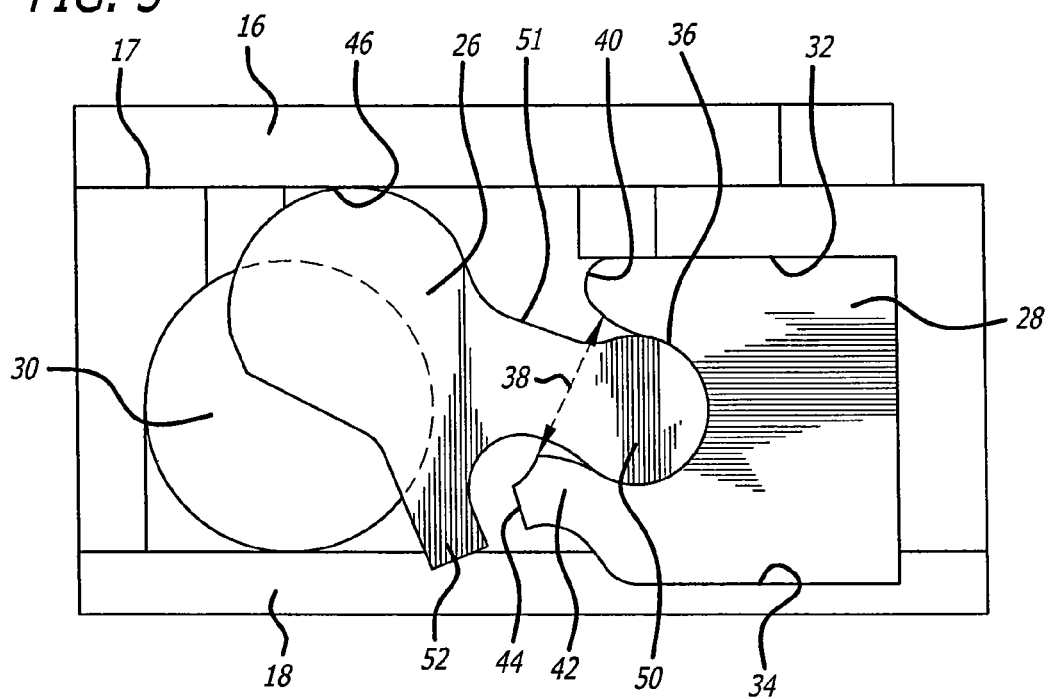
FIG. 3 is an enlarged, cross-sectional view of the link and mount in the engaged position.
Figure 4:
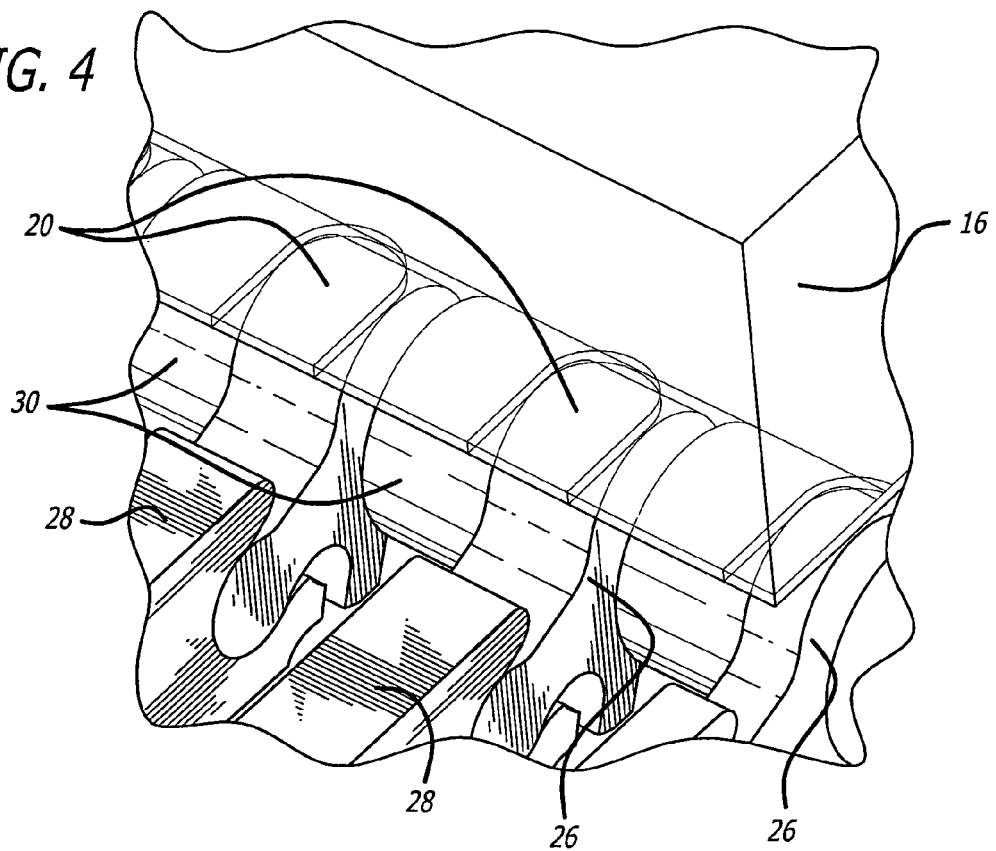
FIG. 4 is an enlarged, perspective view of the contact between the integrated circuit and the connector link.

FIG. 3 represents the condition of the connector 22 after the IC 16 has been placed on the platform. The connector 22 that establishes an electrical connection is a two piece assembly having a link member 26 and a mount element 28. A resilient tubular member 30 is housed in the platform 12, and serves to bias the connector 22 in the disengaged position. The mount 28 is retained in the platform 12 and includes a generally planar upper surface 32 and a generally planar lower surface 34. In a preferred embodiment, the platform 12 is sized to compress the mount 28 slightly so that it extends into and slightly embeds the test equipment contact surface 18. Between the lower and upper surfaces is a laterally opening cavity 36 having a slightly upwardly tilted orientation. The cavity 36 is substantially circular up to a mouth 38, which then gradually widens toward the link 26, and the cavity is approximately sized to retain a portion of the link member therein. The upper edge of the mouth 38 transitions to the upper surface 32 through a curved finger-like projection 40. Similarly, the lower edge of the mouth 38 transitions to the lower surface 34 through a projecting lip member 42. The lip member 42 has a lower edge that curves upward to a front edge 44.

The link 26 has three main components. The first component is an arcuate contact surface 46 along the upper edge that is shaped to permit rolling contact with the IC above as the IC applies a downward force on the link 26, causing the link 26 to pivot about the mount 28. The second component of the link 26 is a rocker arm 48 having a neck portion 51 that terminates in a bulb-shaped distal tip 50. The cavity 36 of the mount 28 and the bulb-shaped distal tip of the rocker arm 48 are complimentary sized to allow smoothing pivoting of the rocker arm within the cavity of the mount in a controlled manner without undue wobble. The tubular member 30 is resilient and biases the arcuate surface clockwise (upward) so as to project through the slot 24 of the platform 12. With the link rotated in the position, a leg member 52 is rotated out of contact with the test equipment 18. This is the disengaged position (not shown), or stand-by position as the connection assembly is ready for the presence of the IC chip.

As seen in FIG. 3, when the IC 16 is brought to bear against the platform 12, the lower surface 17 of the IC 16 contacts the protruding arcuate surface 46 of the link 26 and pushes the link down against the bias of the resilient tubular member 30. This downward force brought to bear by the IC rotates the link counterclockwise against the bias of the resilient member 30, as the link 26 pivots about the mount via the rocker arm 48. This rotation of the link 26 continues until the leg member 52 makes solid contact with the test equipment 18. Further downward force only increases the pressure applied by the rocker arm 48 at the cavity 36 of the mount 28 to bolster the reliability of the contact. This is the engaged position, as there is a direct flow path between the contact pad 20 of the IC, through the arcuate contact surface 48 of the link 26 and through the rocker arm 48 to the mount 28, which is embedded on and affixed to a lead (not shown) of the load board/test equipment 18. The flow path being established, signals can then be processed by the test equipment from the IC in the conventional manner. It should be noted that there is no deformation of any component of the connector assembly, and therefore no part of the connector assembly can lose its resiliency and have the contact pressure diminish over time.

The present invention directly addresses the concerns of the prior art, and provides an IC test socket with marginal redirection behavior in which repeatable low inductance and contact resistance are reliably maintained. Tests performed on the socket yielded a first pass yield percentage of 93.3% and a final yield of 95.3%, compared with 87% and 94%, respectively, of comparable sockets. The device to board distance in a preferred embodiment is less than 0.5 mm, and the signal path was measured to be about 0.654 mm.

It will be understood that this disclosure is merely illustrative, and that it is to be further understood that changes may be made in the details, particularly in matters of shape, size, material, and arrangement of parts without exceeding the scope of the invention. Accordingly, the scope of the invention is as defined in the language of the appended claims, and is not limited in any manner by the aforementioned descriptions and drawings.

I claim:

1. A socket for electrically coupling an integrated circuit (IC) to a board so that a signal may be transmitted thereto, comprising:

a platform for receiving the integrated circuit thereon;

an elongate resilient tubular member housed in the platform; and a plurality of two-piece connector assemblies, each connector assembly comprising a mount and an associated link pivotable about the mount, each connector assembly having first and second positions, the first position comprising an engaged position wherein an electrical contact is established between the integrated circuit and the board, and a standby position where the link does not establish an electrical contact between the integrated circuit and the board;

wherein the mounts are retained in the platform and comprise a curved cavity on a lateral side opposite an associated link member; and wherein the associated link member has an arcuate contact surface on an upper side adapted for rolling contact with the integrated circuit, a rocker arm laterally displaced with a bulb-shaped tip seated in the curved cavity of the mount, the link vertically pivotable about bulb tip, and a downwardly sloping leg member wherein the elongate resilient tubular member biases the connector assemblies in the standby position; and wherein contact between the integrated circuit and the platform pivots the connector assemblies from the standby position to the engaged position.

2. The socket of claim 1, wherein the signal path between the integrated circuit and the board is approximately 0.65 mm.

3. The socket of claim 1 wherein a distance between the IC and the board is 0.5 mm.

4. The socket of claim 1 wherein the connector assembly undergoes no deformation between the engaged position and the disengaged position.

5. The socket of claim 1 wherein the link member is disposed between the resilient tubular member and the mount.

6. The socket of claim 1 wherein the platform includes an array of slots aligned with a series of contact pads on the IC, and wherein each of the links project out of a one of the array of slots.

* * * * *